US006717414B1

(12) United States Patent
Rodrigo et al.

(10) Patent No.: US 6,717,414 B1
(45) Date of Patent: Apr. 6, 2004

(54) SELF-BALANCING IONIZER MONITOR

(75) Inventors: Richard D. Rodrigo, Chalfont, PA (US); William S. Richie, Jr., Pennsville, NJ (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 09/868,842

(22) PCT Filed: Dec. 22, 1999

(86) PCT No.: PCT/US99/30521

§ 371 (c)(1),
(2), (4) Date: Oct. 17, 2001

(87) PCT Pub. No.: WO00/38288

PCT Pub. Date: Jun. 29, 2000

Related U.S. Application Data

(60) Provisional application No. 60/113,211, filed on Dec. 22, 1998.

(51) Int. Cl.[7] ........................ G01N 27/62; G01R 31/08

(52) U.S. Cl. ........................................ 324/464; 324/522

(58) Field of Search ................................ 324/464, 522; 361/213, 231

(56) References Cited

U.S. PATENT DOCUMENTS 4,740,862 A * 4/1988 Halleck ...................... 324/464
4,794,329 A * 12/1988 Schweitzer, Jr. ............ 324/522
5,008,594 A 4/1991 Swanson et al. ........ 315/111.81
5,017,876 A * 5/1991 Wright et al. ............... 324/464
5,153,811 A 10/1992 Rodrigo et al. ............. 361/231

FOREIGN PATENT DOCUMENTS

EP 0 212 931 3/1987 ............ H01J/23/00

* cited by examiner

*Primary Examiner*—N. Le
*Assistant Examiner*—Timothy J. Dole
(74) *Attorney, Agent, or Firm*—Lowe Hauptman Gilman & Berner LLP

(57) ABSTRACT

A monitor apparatus and corresponding method of monitoring high voltage alternating current in the emitter and reference circuits of ionizers. The monitor is capacitively coupled to the emitter and reference circuits to detect faults without affecting the ionizer operation. Faults are displayed on a light emitting diode display. In an alternative embodiment, faults may be indicated by output signals. The output signals are used to automatically adjust the ionizer operation.

21 Claims, 2 Drawing Sheets

SELF-BALANCING IONIZER MONITOR

RELATED APPLICATIONS

The present application claims priority of U.S. Provisional Application Ser. No. 60/113,211, filed Dec. 22, 1998, entitled “Self-Balancing Ionizer Monitor”, the disclosure of which is incorporated by reference herein in its entirety.

TECHNICAL FIELD

This invention pertains to ion balance monitor methods and apparatus. The ion balance monitor monitors the ion output and ion balance of the ionizer and indicates the status of the ionizer to an operator. Such ion balance expedients are useful in controlling the desired balance or desired degree and type of imbalance of positive and negative ions in gas environments. More particularly, the invention is useful in connection with air blowers and charged electrode ion emitters as are used in controlling the ionization polarity in rooms or other spaces. Such control is useful in many fields, as in controlling the ionization of the air in clean rooms in which microchips are manufactured, as a single example.

BACKGROUND ART

There is a need to monitor ionizers for (1) ion output and (2) ion balance. This is fairly easy to achieve with DC ionizers by monitoring the DC current due to ionization in the return of the power supply. It is more difficult to do with AC ionizers, especially of the self-balancing type, due to lack of return on power supply and the fact that AC ionization current is very small as compared with other currents in the AC high voltage circuit.

Some prior attempts have been made to monitor the ion balance in an ionizer. Known attempts include U.S. Pat. No. 4,477,263. This patent discloses a DC grid with a sensor system to monitor the balance. The balance is sensed in the room and is manually adjusted to a null meter reading on the controls.

U.S. Pat. No. 4,630,167 discloses a plate sensor in the work area and an infrared link to control ion balance in a pulsed DC system having spaced apart emitters.

U.S. Pat. No. 4,809,127 discloses a pulsed DC system of air ionizers. The ion current is sampled through a resistor and is used to regionally adjust the emitter output.

U.S. Pat. No. 4,901,194 discloses sequenced positive and negative pulses. The ion current with an integrating feature maintains average ion conditions in the room and controls the pulse generators.

U.S. Pat. No. 4,951,172 discloses a guarded sensor/control system. The sensor is a guarded probe placed in the work area.

There are of course many patents relating to ion balance. These include the following U.S. Pat. Nos.: 2,264,495; 2,879,395; 3,714,531; 4,423,462; 4,092,543; 3,936,698; 4,740,862; 4,757,422; 4,872,083; 5,008,594; 5,055,963; 5,153,811; 3,711,743; 4,435,195; 5,047,892; 5,057,966; 4,476,514; 4,528,612; 4,974,115; 4,542,434; 4,878,149; 4,642,728; 4,757,421; and 4,785,248.

SUMMARY OF THE INVENTION

The monitor of the present invention senses the high voltage alternating current in the emitter and senses the reference circuits of the ionizer. The sensing circuits are capacitively coupled to the emitter and reference circuits. Faults may be detected and displayed on trip alarm light emitting diode displays or by other output signals. The output signals may be used to automatically adjust the system by known means. Capacitive coupling used in this way is believed to be novel. The invention permits the monitoring function to be accomplished without interfering with the operation of the self-balancing circuit.

It is accordingly an object of the present invention to monitor ionizers for ion output and ion balance.

Another object is to monitor ionizers for ion output and balance in AC ionizers, particularly of the self-balancing type.

Still another object is to monitor high voltage and ion output and ion balance in self-balancing ionizers by sensing AC high voltage in both high voltage emitter and reference circuits.

There are certain typical, though rare, faults that adversely affect the ion balance. Faults that produce no ion output, such as a dead transformer, the emitter shorted to ground, or the emitter shorted to reference, etc., result in zero or very low AC voltage to ground in the emitter circuit. Faults that result in ion imbalance, such as the reference shorted to ground, result in a zero or very low AC voltage to ground in the reference circuit. In the present invention, the emitter and reference circuits are capacitively coupled with the sensing circuits whereby normal and abnormal operation are sensed without interfering with the function of the self-balancing circuit. This sensing is accomplished by performing a peak detection of the AC signal present on both the emitter and reference circuits, separately. These peak detected signals are then passed on to circuits with variable thresholds. The comparator circuits are used to trip alarm LEDs when the peak detector levels fall below the thresholds. Optional output signals of any desired other kind can be derived from these processed signals by known conventional means.

Still other objects and advantages of the present invention will become readily apparent to those skilled in this art from the following detailed description, wherein only the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BEST MODE FOR CARRYING OUT THE INVENTION

The monitor according to the present invention operates by sensing the AC high voltage in the emitter and reference circuits of the ionizing assembly. Under normal conditions, the emitter circuit has approximately 3 KVAC (kilovolt alternating current) with respect to ground and the reference circuit has approximately 2 KVAC with respect to ground.

Existing monitoring circuits typically depend on measuring current due to ionization itself. This direct measurement typically results in connections between the ionizing circuit and ground through which net DC currents can flow. These connections to ground with net DC currents are incompatible with the operation of self-balancing ionizers. The monitoring circuit of the present invention uses capacitors (either discrete components or via capacitive coupling) to block DC currents to ground.

The use of capacitive coupling to monitor a self-balancing ionizer's performance is a new expedient. Intrusive (directly connected) monitoring systems were incompatible with and would interfere with the operation of self-balancing ionizers The fact that the self-balancing ionizer uses AC enables the use of capacitive coupling to monitor the ionizer performance.

This circuit enables the monitoring of two aspects (ion output and ion balance) in self-balancing ionizers. The monitor does not affect the operation of the self-balancing circuit. The monitoring is performed in a cost effective manner. This circuit can provide ionizer operation status output for remote monitoring.

It has been found possible in the present invention to monitor high voltage (HV) ion output and ion balance on self-balancing ionizers by sensing the AC HV in both the HV (emitter) and reference circuits. Under normal conditions approximately 3 KVAC with respect to ground manifests itself in the HV (emitter) circuit and approximately 2 KVAC with respect to ground manifests itself in the reference circuit.

Typical faults for no ionization (dead transformer, or points shorted to ground) result in zero or very low AC voltage to ground in the HV (emitter) circuit. Typical faults for ion imbalance (reference shorted to ground) result in zero or very low AC voltage to ground in the reference circuit.

Figure 1:
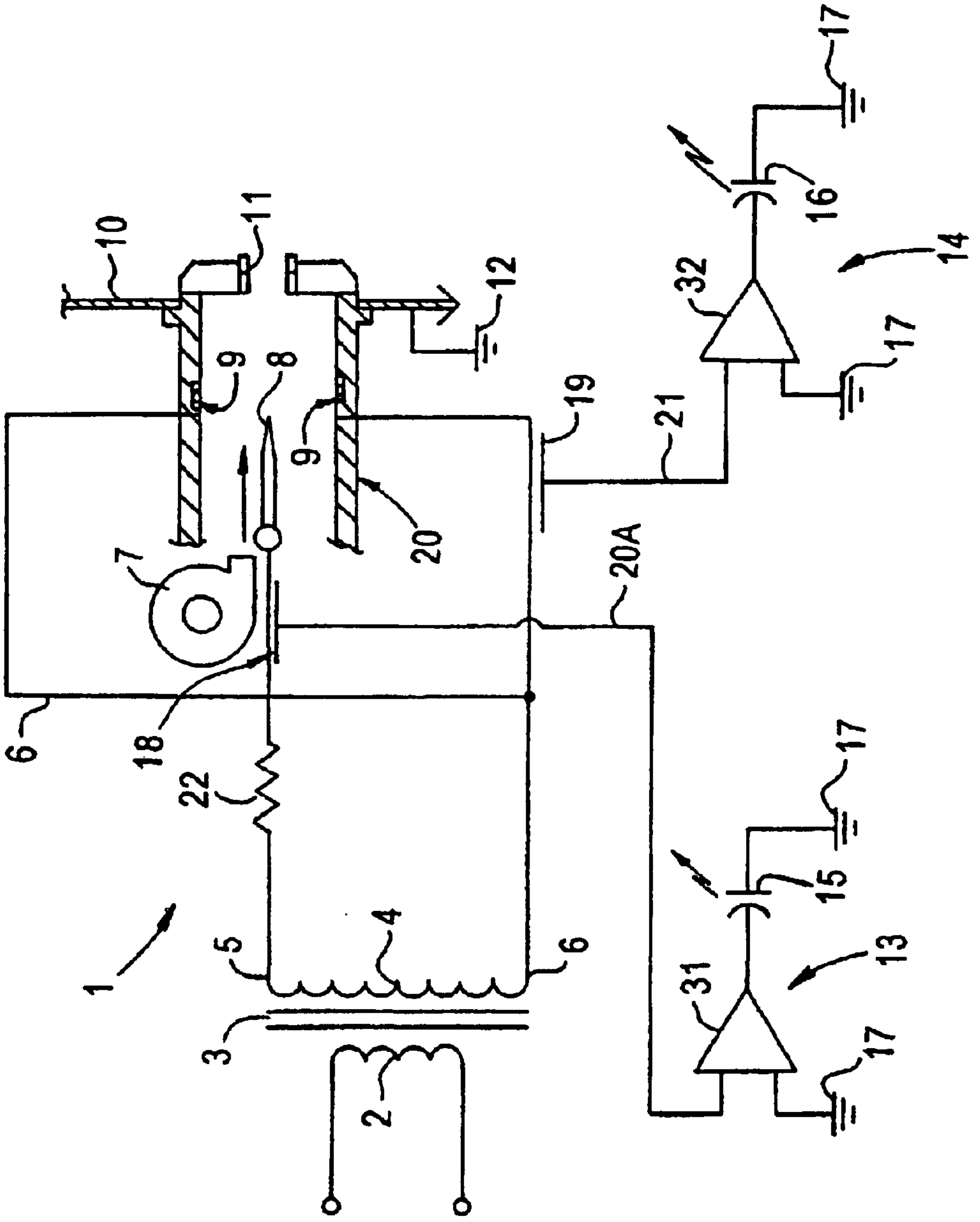
FIG. 1 is a schematic view of the overall ionizer apparatus showing the connections and relationships of the ion balance and ion output circuits.

The present invention is able to monitor for these conditions as best initially shown in FIG. 1. This simple circuit provides monitoring of self-balancing ionizers without affecting the self-balancing function. An example of such a self-balancing ionizing circuit for a static eliminator to which the present invention may be applied is shown in U.S. Pat. No. 5,153,811. The high voltage transformer is generally designated 1. It comprises a primary winding 2, a core 3, and a secondary winding 4. The high voltage lead 5 connects one end to the secondary to the HV electrode emitter 8. The reference lead 6 connects to the other end of the secondary to the reference electrode 9.

A blower 7 propels a stream of air in the direction indicated by the arrow over the emitter 8, the reference electrode 9 and through the orifice 11 into the region to be treated. The electrodes are contained within an ionizing chamber 20. The orifice 20 is mounted on and the whole ionizing device is encased in case 10. The structure described above in connection with FIG. 1 is conventional.

A high voltage capacitive pickup 18 is provided at the HV lead 5. An ion output sensing lead 20A connects capacitive pickup 18 to an ion output sensor generally designated 13. The ion output sensor 13 comprises a comparator 31 shown in simplified form and a LED alarm display 15.

A reference voltage capacitive pickup 19 is provided at the reference lead 6. An ion balance lead 21 connects capacitive pickup 19 to an ion balance sensor generally designated 14. The ion balance sensor 14 comprises a comparator 32 shown in simplified form and a LED alarm display 16.

The case 10 is provided with ground 12 and the comparators 31 and 32 are each provided with grounds 17, as shown in FIG. 1. Each of the comparators may be a standard part LM339, though it is understood that the specification herein of a particular industry part number or description does not limit the invention, and functional equivalents for any of the specified components may be used as within the skill of the art.

Figure 2:
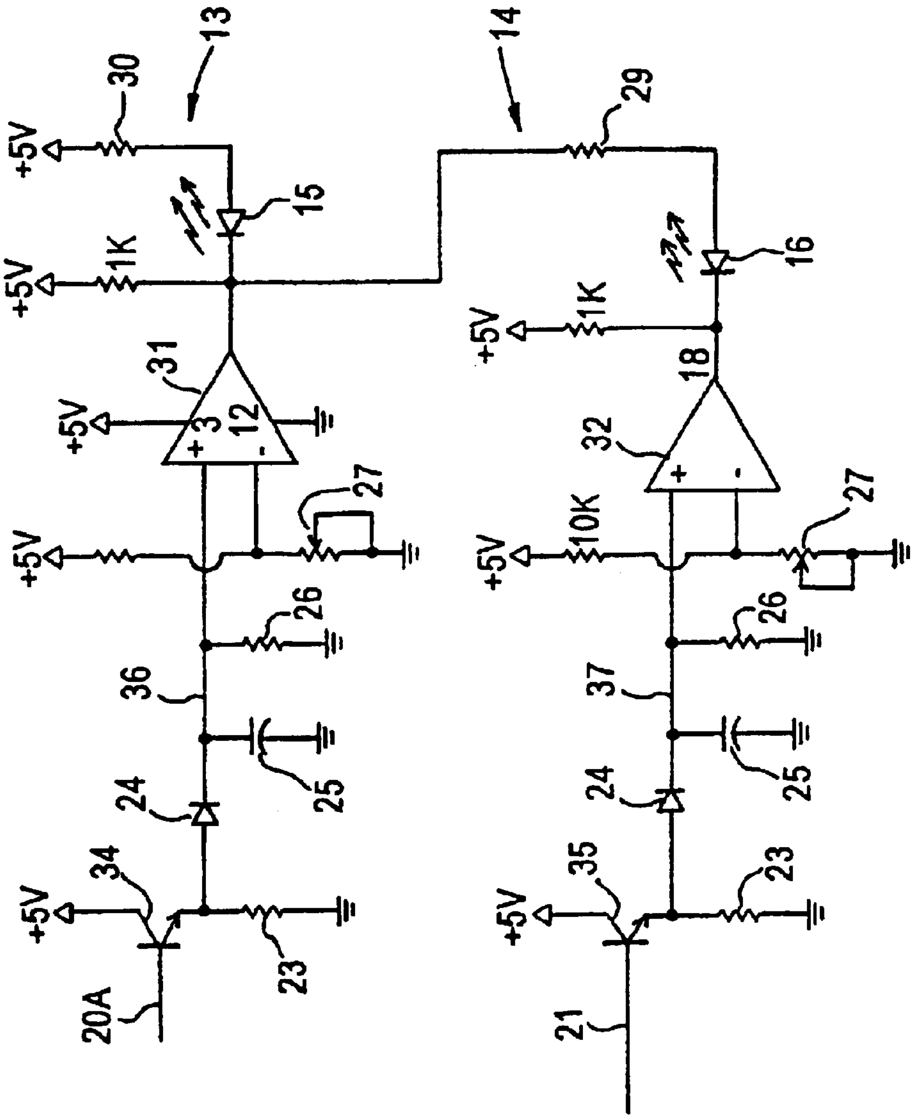
FIG. 2 is a schematic view of the details of the ion balance and ion output monitor circuits.

The output sensors 13 and 14 are shown in more schematic detail in FIG. 2. The upper portion of FIG. 2 shows the ion output sensor 13 portion and the lower portion of FIG. 2 shows the ion balance 14 portion. Like reference numerals and part designations in the upper and lower portions refer to like parts. As shown in FIG. 1, the HV lead 5 is capacitively coupled 18 to lead 20A and the reference lead 6 is capacitively coupled 19 to lead 21. The signals from the capacitor couplings 18 and 19 are each amplified through a transistor 34 and 35 respectively, standard part MPS2222A, the outputs of which continue through diode 24, which is standard part 1N4002. Thereafter, each of the leads 36 and 37 is grounded through a 1 microfarad capacitor 25 and also each is grounded through a 1M Ohm resistor 26.

Continuing the path of each lead 36 and 37, each is connected to a + (positive) input of a comparator 31 and 32, respectively. A +5 volt source is connected through a 10K Ohm resistor and to ground through a variable 10K Ohm resistor 27 and thence to the – (negative) input of a comparator. The variable resistors are set to provide the desired thresholds. Thereafter, the output of each comparator 31 and 32 is grounded through a 1K Ohm resistor and then continues respectively to an ion output display alarm 15 or a balance alarm display 16. The back end of display 16 is coupled to the front end of display through 1.2K Ohm resistor 29. The back end of display goes to a +5 volt source through a 1.2K Ohm resistor 30. The structure is best understood by reference to FIG. 2.

If the AC signal disappears from the HV leads, the ion output alarm occurs. If the AC signal disappears from the referencing leads, the ion balance alarm occurs. If the AC signal disappears from both leads, only the ion output alarm occurs.

It will be readily seen by one of ordinary skill in the art that the present invention fulfills all of the objects set forth above. After reading the foregoing specification, one of ordinary skill will be able to effect various changes, substitutions of equivalents and various other aspects of the invention as broadly disclosed herein. It is therefore intended that the protection granted hereon be limited only by the definition contained in the appended claims and equivalents thereof.

What is claimed is:

1. A method of detecting faults in high voltage circuits of an ionizer without affecting operation of said high voltage circuits, said method comprising the steps of:

sensing the voltage of said high voltage circuits by capacitively coupling a sensing circuit with said high voltage circuit; and comparing the sensed voltage with a threshold voltage;

wherein said threshold voltage is preset.

2. A method as in claim 1, further comprising the step of displaying an alarm if said sensed voltage is less than or equal to said threshold voltage.

3. A method as in claim 1, wherein said ionizer has a reference circuit or an emitter circuit and said sensing step includes capacitively coupling a sensing circuit with said reference circuit or said emitter circuit.

4. A method as in claim 1, further comprising the step of controlling said ionizer in response to said sensing step sensing a voltage less than or equal to said threshold voltage.

5. In combination, an ionizer having a high voltage circuit and a monitoring circuit adapted to detect faults in said high voltage circuit of said ionizer;

said high voltage circuit comprising a high voltage electrode emitter which has an emitter end for ionizing gas molecules in a vicinity of said emitter end when a high voltage is applied to said electrode emitter; and said monitoring circuit comprising a high voltage sensing circuit for detecting the faults, said sensing circuit being capacitively coupled to said high voltage circuit at a location outside the vicinity of said emitter end.

6. The combination of claim 5, wherein said high voltage circuit further comprises a high voltage source for providing the high voltage, said electrode emitter being coupled to said high voltage source by an electrical connection, said sensing circuit comprising a capacitive coupling to said electrical connection between said electrode emitter and said high voltage source.

7. The combination of claim 5, wherein said ionizer further has a reference circuit comprising a reference electrode to which a reference voltage is applied and which is positioned adjacent said emitter end, said monitoring circuit further comprising a reference sensing circuit capacitively coupled to said reference circuit for additionally detecting faults in said reference circuit.

8. The combination of claim 7, wherein said reference sensing circuit includes a capacitive coupling to said reference circuit at a location outside the vicinity of said emitter end.

9. The combination of claim 7, wherein said high voltage sensing circuit includes an ion output alarm adapted to be triggered when the high voltage detected in the high voltage circuit drops below a first predetermined level; and said reference sensing circuit includes an ion balance alarm adapted to be triggered when the reference voltage detected in the reference circuit drops below a second predetermined level.

10. The combination of claim 7, wherein the reference voltage is higher than ground.

11. The combination of claim 5, said monitoring circuit further comprises a control circuit coupled to said high voltage sensing circuit for controlling said ionizer responsive to fault detection.

12. In combination, an ionizer having high voltage circuits and a monitoring circuit adapted to detect faults in at least one of said high voltage circuits of said ionizer;

said monitoring circuit comprising a sensing circuit for detecting the faults, said sensing circuit having a capacitive coupling to said at least one high voltage circuit, wherein said capacitive coupling does not create a current path for charges generated by said ionizer.

13. The combination of claim 12, wherein said high voltage circuits comprise an emitter circuit having an electrode emitter to which an emitter voltage is applied; and a reference circuit having a reference electrode to which a reference voltage is applied and which is positioned adjacent the electrode emitter, wherein said sensing circuit comprises an ion balance sensor that has said capacitive coupling to said reference circuit.

14. The combination of claim 13, wherein said ionizer is a self-balancing ionizer.

15. The combination of claim 13, wherein said sensing circuit further comprises an ion output sensor that has another capacitive coupling to said emitter circuit, said another capacitive coupling being positioned well beyond a corona region of said emitter circuit.

16. The combination of claim 15, wherein said ion output sensor further has an ion output alarm and said ion balance sensor further has an ion balance alarm, said alarms being electrically connected so that a triggering of the ion output alarm disables a possible triggering of the ion balance alarm.

17. The combination of claim 12, further comprising a control circuit coupled to said sensing circuit for controlling said ionizer responsive to fault detection.

18. A method of detecting faults in high voltage circuits of an ionizer without affecting operation of said high voltage circuits, said method comprising the steps of:

sensing the voltage of said high voltage circuits by capacitively coupling a sensing circuit with said high voltage circuit; and comparing the sensed voltage with a threshold voltage;

wherein said step of capacitively coupling is performed without creating a current path for charges generated by said ionizer.

19. A method of detecting faults in high voltage circuits of an ionizer without affecting operation of said high voltage circuits, said method comprising the steps of:

sensing the voltage of said high voltage circuits by capacitively coupling a sensing circuit with said high voltage circuit; and comparing the sensed voltage with a threshold voltage; wherein said high voltage circuits comprise an emitter circuit having an electrode emitter to which an emitter voltage is applied, and a reference circuit having a reference electrode to which a reference voltage is applied and which is positioned adjacent the electrode emitter; and said sensing comprises detecting both the emitter and reference voltages.

20. A ionizer monitoring circuit for detecting faults in a high voltage circuit of an ionizer without affecting operation of said high voltage circuit, said monitoring circuit comprising:

sensing means for sensing a high voltage of said high voltage circuit;

coupling means for capacitively coupling said sensing means to said high voltage circuit without creating a current path for charges generated by said ionizer; and comparing means for comparing the sensed high voltage with a threshold.

21. The ionizer monitoring circuit of claim 20, wherein said high voltage circuit comprises an emitter circuit having an electrode emitter to which a higher, emitter voltage is applied, and a reference circuit having a reference electrode to which a lower, reference voltage is applied and which is positioned adjacent the electrode emitter; and said sensing means comprise first and second separate sensing means for detecting the emitter and reference voltages, respectively; and said comparing means comprise first and second separate comparing means for comparing the detected emitter and reference voltages to first and second threshold, respectively.

* * * * *